(12) United States Patent
Chen et al.

(10) Patent No.: US 11,348,818 B2
(45) Date of Patent: May 31, 2022

(54) SLIT DOOR ASSEMBLY AND METHOD OF OPERATING THE SAME

(71) Applicant: TAIWAN SEMICONDUCTOR MANUFACTURING COMPANY LTD., Hsinchu (TW)

(72) Inventors: Yen-Ji Chen, Hsinchu (TW); Jer-Shien Yang, Hsinchu (TW); Chien-Hung Lin, Hsinchu (TW); Pei-Sheng Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/070,373

(22) Filed: Oct. 14, 2020

(65) Prior Publication Data
US 2022/0115255 A1    Apr. 14, 2022

(51) Int. Cl.
*H01L 21/677* (2006.01)
*H01L 21/67* (2006.01)

(52) U.S. Cl.
CPC .. *H01L 21/67772* (2013.01); *H01L 21/67201* (2013.01); *H01L 21/67706* (2013.01); *H01L 21/67766* (2013.01)

(58) Field of Classification Search
None
See application file for complete search history.

(56) References Cited

U.S. PATENT DOCUMENTS

| | | | | | |
|---|---|---|---|---|---|
| 1,373,415 | A | * | 4/1921 | Engh | F01B 17/00 418/253 |
| 3,352,061 | A | * | 11/1967 | Chan | E05F 5/003 49/507 |
| 6,106,213 | A | * | 8/2000 | Denker | H01L 21/67772 414/217 |
| 2009/0035098 | A1 | * | 2/2009 | Igarashi | H01L 21/67373 414/217 |

* cited by examiner

*Primary Examiner* — Gerald McClain
(74) *Attorney, Agent, or Firm* — WPAT, P.C., Intellectual Property Attorneys; Anthony King

(57) ABSTRACT

A slit door assembly includes a door plate, a supporting arm including a first end coupled to the door plate and a second end away from the first end, and a linkage unit including a rod member and a pin member protruding from the rod member and connecting to the second end of the supporting arm. A fillet is disposed between the pin member and the rod member. A method of operating a slit door assembly includes receiving a door plate, receiving a supporting arm coupled to the door plate, and coupling a linkage unit to the supporting arm, wherein the linkage unit includes a pin member and a rod member, the pin member is protrudes from the rod member and having a fillet. The method further includes applying a first force to the linkage unit to move the door plate from a first position to a second position.

20 Claims, 15 Drawing Sheets

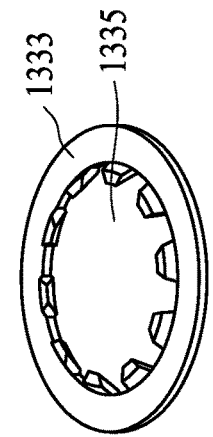
FIG. 7A
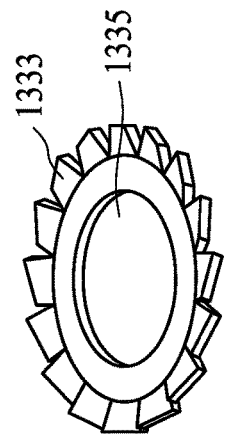
FIG. 7B
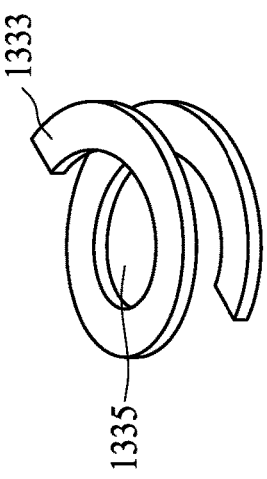
FIG. 7C
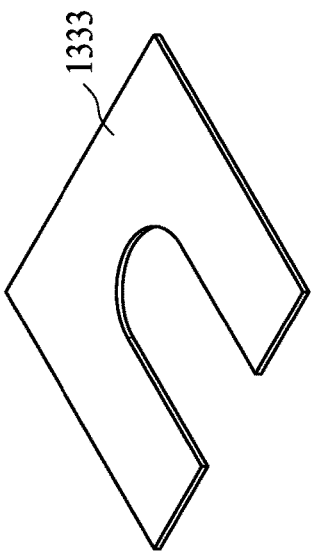
FIG. 7D
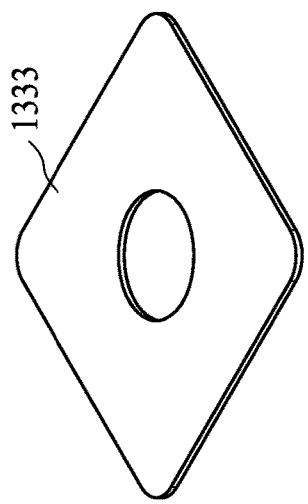
FIG. 7E
FIG. 7F

SLIT DOOR ASSEMBLY AND METHOD OF OPERATING THE SAME

BACKGROUND

In order to efficiently perform consecutive processes upon one or more substrates, multiple processing chambers may be coupled together. It is common to perform numerous consecutive processes upon the substrates or wafers of a semiconductor, a flat panel display, a photovoltaic, and a solar panel. To transfer substrates from one processing chamber to another processing chamber, a transfer chamber may be coupled with one or more processing chambers. The transfer chamber may remove one or more substrates from a processing chamber and transfer the substrate to one or more other processing chambers, or a load lock chamber.

At each interface between chambers, a slit door assembly may be present. The slit door assembly, when opened, permits one or more substrates to be transferred between adjacent chambers. When the slit door assembly closed, the chamber may be sealed from adjacent chambers so that each chamber may have its own environment isolated from an adjacent chamber, and the substrates may not be transferred between the chambers.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 7A to 7F are schematic views of a gasket according to aspects of the present disclosure in some embodiments.

DETAILED DESCRIPTION

Figure 1:
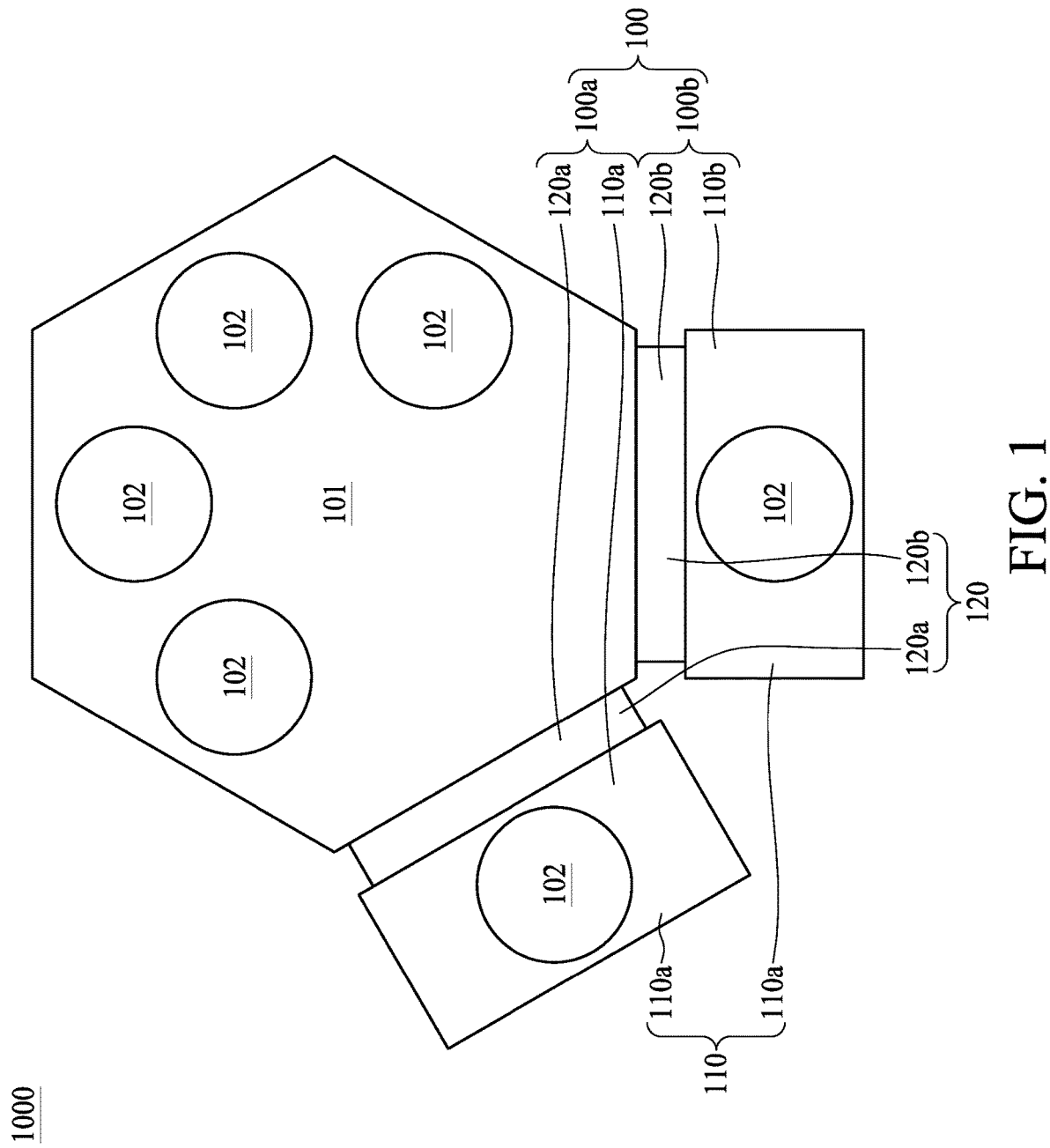
FIG. 1 is a schematic top view of a processing unit including a slit door assembly disposed between chambers in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In the present disclosure, a slit door assembly, a chamber unit and a method of operating the slit door assembly are provided. In particular, a slit door assembly including a linkage unit and a chamber unit including the linkage unit are described below. In addition, a method of operating a slit door assembly including the linkage unit is also provided below. Other features and processes may also be included. The slit door assembly includes a linkage unit configured to connect an actuator unit to a door plate to move the door plate. The linkage unit provided according to some embodiments of the present disclosure may distribute stress concentration to extend the service life of the linkage unit. Further, the linkage unit can be used repeatedly by replacing a pin member, thereby extending the service life.

FIG. 1 is a schematic top view of a processing equipment 1000 including a transfer chamber 101, a first processing unit 100a and a second processing unit 100b according to aspects of the present disclosure in some embodiments. In some embodiments, the first and second processing units 100a and 100b are coupled to the transfer chamber 101. In some embodiments, the first processing unit 100a includes a first chamber 110a and a first slit door assembly 120a disposed between the transfer chamber 101 and the first chamber 110a, and the second processing unit 100b includes a second chamber 110b and a second slit door assembly 120b disposed between the transfer chamber 101 and the second chamber 110b.

In some embodiments, the first and second processing units 100a and 100b are in configurations similar to each other. In some embodiments, the first and second slit door assemblies 120a and 120b are in configurations similar to each other. In some embodiments, the first and second chambers 110a and 110b are configured to perform different operations or processes. Although FIG. 1 illustrates the processing equipment 1000 includes only two (the first and second) processing units 100a and 100b, it would be understood that the processing equipment 1000 can include one or more processing units. In some embodiments, the first and second chambers 110a and 110b are configured to hold a substrate 102.

In some embodiments, the transfer chamber 101 is a buffer chamber configured to receive one or more substrates 102 leaving the first processing unit 100a or the second processing unit 100b, allow one or more substrates 102 queueing and waiting for entering the first processing unit 100a or the second processing unit 100b for the next operation or process. In some embodiments, the first chamber 110a or the second chamber 110b may be a processing chamber or a load lock chamber. In some embodiments, the transfer chamber 101 may retrieve one or more substrates 102 from the first chamber 110a of the first processing unit 100a passing through the first slit door assembly 120a, and then transfer the one or more substrates 102 to the second processing unit 100b passing through the second slit door assembly 120b. In some embodiments, the first processing unit 100a may be directly coupled to the second processing unit 100b, and a third slit door assembly 120c (not shown) may be coupled therebetween.

The chamber 110 may be any suitable process chamber for processing substrates 102 such as a plasma-enhanced chemical vapor deposition (PECVD) chamber, a physical vapor deposition (PVD) chamber, or another chamber. The substrates 102 to be processed may be semiconductor substrates, flat panel display substrates, solar panel substrates, or any other substrate. Within each chamber 110, one or more substrates 102 may be processed.

Figure 2:
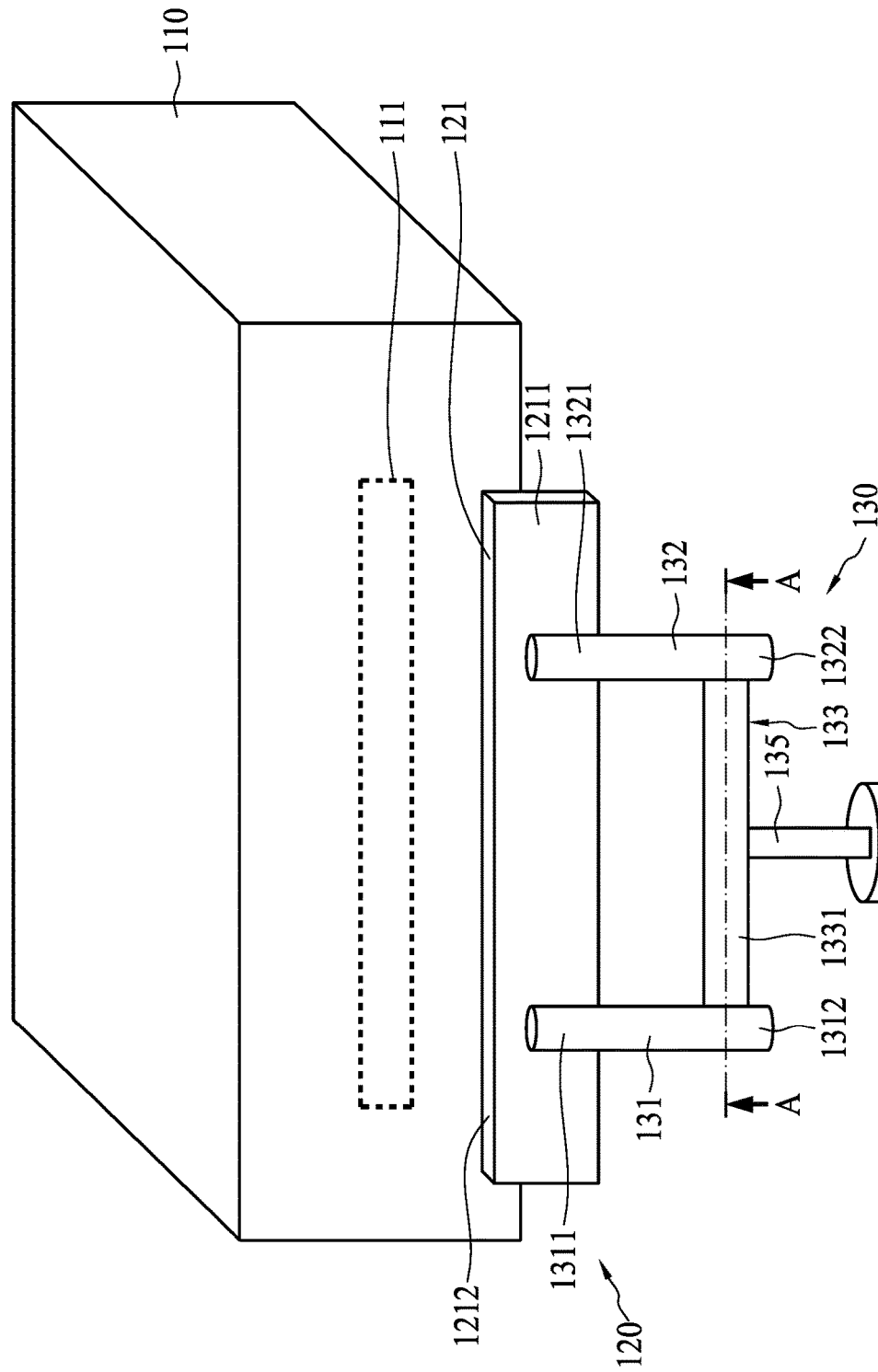
FIG. 2 is a schematic view of a processing unit in a first configuration according to aspects of the present disclosure in some embodiments.
Figure 3:
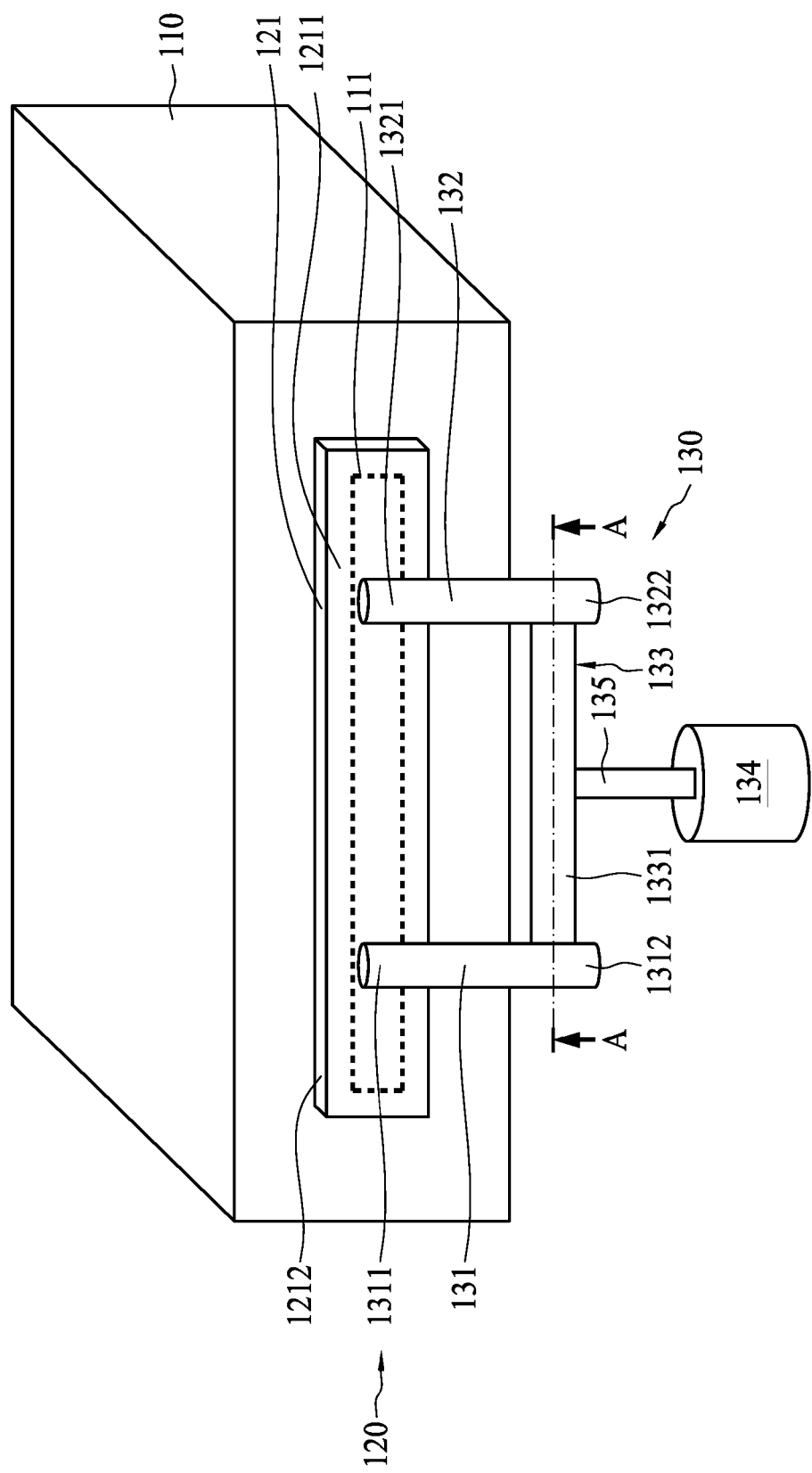
FIG. 3 is a schematic view of a processing unit in a second configuration according to aspects of the present disclosure in some embodiments.

FIG. 2 is a schematic view of a processing unit according to aspects of the present disclosure in some embodiments. Referring to FIG. 2, in some embodiments, the processing unit 100 includes the chamber 110 having an opening 111 for accessing the chamber 110, and the slit door assembly 120 disposed adjacent to the chamber 110. The slit door assembly 120 includes a door plate 121 adjacent to the opening 111, and an actuating unit 130 coupled to a first surface 1211 of the door plate 121. The actuating unit 130 is configured to move the door plate 121. In some embodiments, the door plate 121 is movable between a first position (e.g. as shown in FIG. 2) and a second position (e.g. as shown in FIG. 3), wherein the chamber 110 is in an open configuration when the door plate 121 is at the first position, and the chamber 110 is in a closed configuration when the door plate 121 is at the second position. In some embodiments, the actuating unit 130 is operable to move the door plate 121 between the first and second positions. In some embodiments, the first surface 1211 does not contact the opening 111. In some embodiments, a second surface 1212 opposite to the first surface 1211 faces and contacts the opening 111.

The actuating unit 130 includes a first supporting arm 131 coupled to the door plate 121, and a linkage unit 133 connected to the first supporting arm 131. In some embodiments, the first supporting arm 131 is coupled to the surface 1211 of the door plate 121.

In some embodiments, the first supporting arm 131 includes a first end 1311 coupled to the door plate 121 and a second end 1312 away from the first end 1311. In some embodiments, the actuating unit 130 further includes a second supporting arm 132. Similarly, the second supporting arm 132 includes a first end 1321 coupled to the surface 1211 of the door plate 121 and a second end 1322 away from the first end 1321. In some embodiments, the first and second supporting arms 131, 132 are disposed at two opposite ends of the surface 1211 of the door plate 121. In some embodiments, the linkage unit 133 is disposed between the first and second supporting arms 131, 132.

Figure 4:
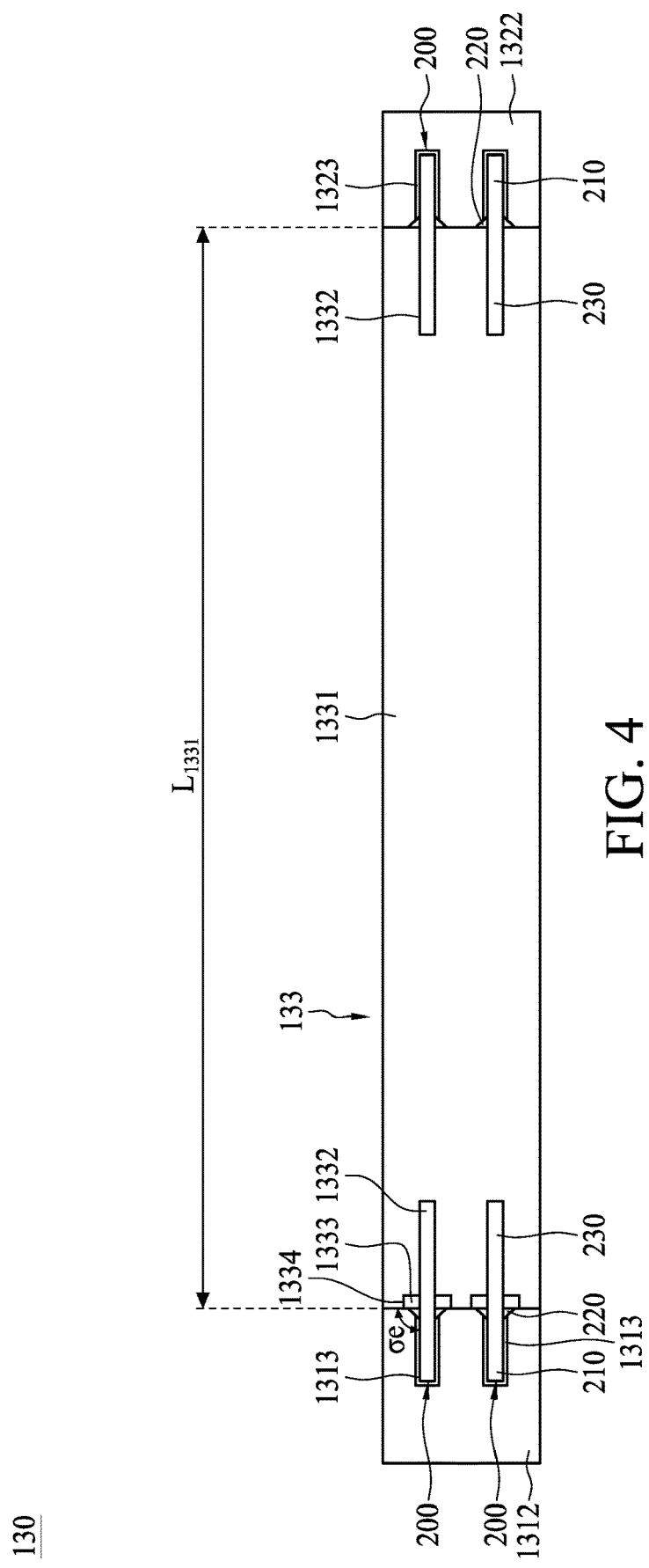
FIG. 4 is a schematic cross-sectional view taken along line A-A in FIG. 2.

FIG. 4 is a schematic cross-sectional view taken along line A-A in FIG. 2 or FIG. 3. Referring to FIGS. 2, 3 and 4, the linkage unit 133 connects to the first supporting arm 131. In some embodiments, the linkage unit 133 includes a rod member 1331 and a pin member 200 protruding from the rod member 1331, and a fillet 220 disposed between the pin member 200 and the rod member 1331. The first supporting arm 131 includes a first recess 1313, configured to receive at least a portion of the pin member 200. In some embodiments, the first recess 1313 is disposed on the second end 1312 of the first supporting arm 131. In some embodiments, the fillet 220 is receivable by the first recess 1313 of the first supporting arm 131.

In some embodiments, two ends of the linkage unit 133 are connected to the first and second supporting arms 131, 132, respectively. In some embodiments, the two ends of the linkage unit 133 connect to the second ends 1312, 1322 of the first and second supporting arms 131, 132, respectively. In some embodiments, the second supporting arm 132 includes a second recess 1323, and the two ends of the linkage unit 133 are receivable by the first recess 1313 and the second recess 1323 of the first and second supporting arms 131, 132, respectively.

In some embodiments, the second recess 1323 is disposed on the second end 1322 of the second supporting arm 132. In some embodiments, the fillet 220 is receivable by the second recess 1323 of the second supporting arm 132. Additionally, the first and second supporting arms 131, 132 have similar features; this is intended to be illustrative and is not intended to limit the embodiments, as, in various embodiments, the first and second supporting arms 131, 132 have similar structures or different structures in order to meet the desired functional capabilities.

In some embodiments, the slit door assembly 120 includes metal. In some embodiments, the first and second supporting arms 131, 132 include metal. In some embodiments, the pin member 200 includes metal. In some embodiments, the rod member 1331 includes metal. However, the disclosure is not limited thereto. In some alternative embodiments, other suitable materials are adapted for the slit door assembly 120.

In some embodiments, the pin member 200 is attachable to and detachable from the rod member 1331. In some embodiments, the rod member 1331 includes a threaded recess 1332, and a portion of the pin member 200 is receivable by the threaded recess 1332. In some embodiments, the pin member 200 is integral with the rod member 1331. In some embodiments, a length $L_{1331}$ of the rod member 1331 depends on the distance between the first and second supporting arms. In some embodiments, the length $L_{1331}$ of the rod member 1331 is in a range of 100 to 1000 mm.

In some embodiments, the pin member 200 includes a protruding portion 210 disposed in the first recess 1313 of the first supporting arm 131. In some embodiments, the fillet 220 is integral with the pin member 220 and adjacent to the protruding portion 210. In some embodiments, the fillet 220 surrounds the pin member 200. The fillet 220 is configured to disperse and relieve the stress of the pin member 200 when the pin member 200 is subjected to stress. Therefore, a life span of the pin member 200 and the entire slit door assembly 120 may be improved or extended.

In some embodiments, the protruding portion 210 protrudes from the rod member 1331 and is receivable by the second end 1312 of the first supporting arm 131. In some embodiments, the protruding portion 210 and the fillet 220 protrude from the rod member 1331 and are receivable by the first recess 1313 of the first supporting arm 131. In some embodiments, a spring (not shown) is disposed on and surrounds the protruding portion 210, and the spring is also receivable by the first recess 1313 of the first supporting arm 131.

In some embodiments, a length $L_{210}$ of the protruding portion 210 depends on the length of the pin member 200 and the length $L_{1331}$ of the rod member 1331. In some embodiments, a ratio of the length $L_{1331}$ to the length $L_{210}$ is in a range of 5:1 to 30:1. In some embodiments, an exterior angle σe between a periphery of the fillet 220 and the rod member 1331 is in a range of 90 to 170 degrees.

In some embodiments, the pin member 200 further includes a threaded portion 230 having a threaded surface, and the fillet 220 is disposed between the protruding portion 210 and the threaded portion 230. In some embodiments, the threaded portion 230 can be received by the threaded recess 1332. The threaded portion 230 is configured to couple the pin member 200 to the rod member 1331.

In some embodiments, a plurality of the pin members 200 protrude from the rod member 1331 and are connected to the second ends 1312, 1322 of the first and second supporting arms 131, 132. In some embodiments, the pin members 200 protrude from the two ends of the rod member 1331. The number of the pin members 200 is not particularly limited, and the number of the first recesses 1313 and the number of the threaded recesses 1332 are adjusted with the number of pin members 200. Additionally, the pin members 200 in FIG. 3 have similar features; this is intended to be illustrative and is not intended to limit the embodiments, as, in various embodiments, the pin members 200 have similar structures or different structures in order to meet the desired functional capabilities.

Figure 5:
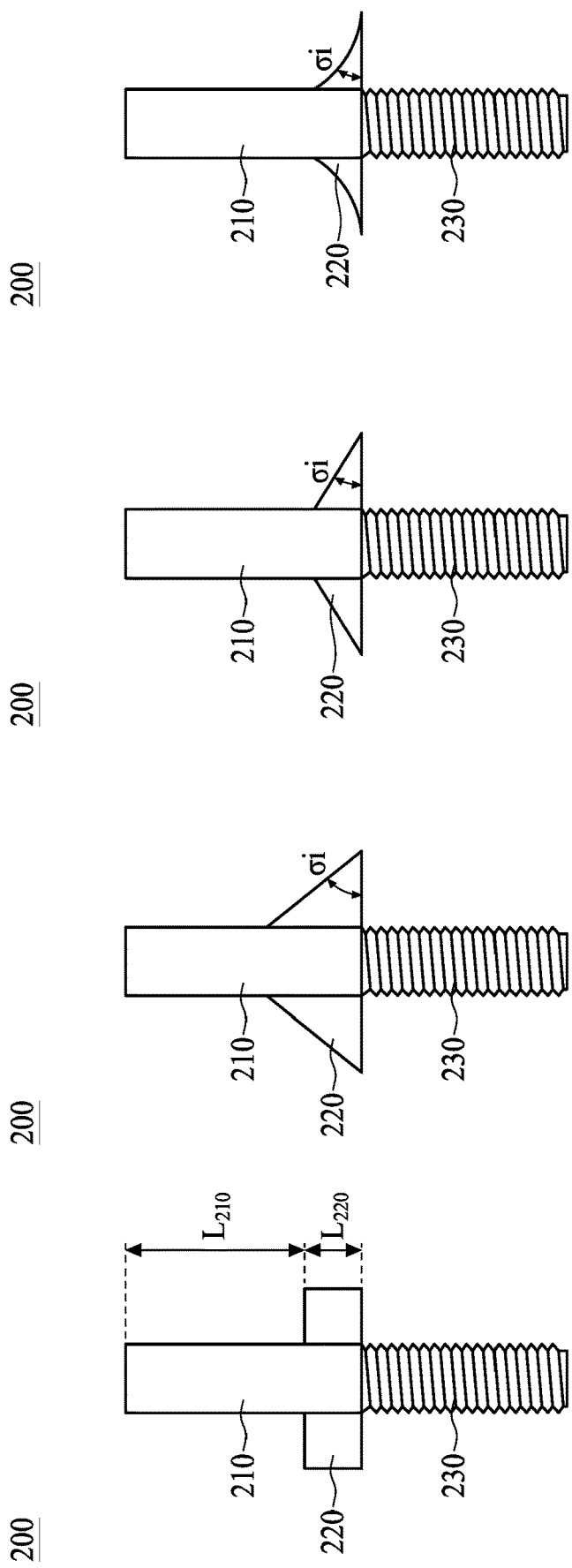
FIGS. 5A to 5D are schematic views of a pin member according to aspects of the present disclosure in some embodiments.

FIGS. 5A to 5D are schematic views of a pin member according to aspects of the present disclosure in some embodiments. The fillet 220 may be any suitable shape, as long as the fillet 220 may disperse the stress of the pin member 200. In some embodiments, as shown in FIG. 5A, the fillet 220 is a flange. In some embodiments, the fillet 220 has an interior angle σi of 90 degrees. In some embodiments, the length $L_{210}$ is in a range of 5 to 50 mm. In some embodiments, a length $L_{220}$ of the fillet 220 depends on the length of the pin member 200 and the length $L_{210}$. In some embodiments, a ratio of the length $L_{210}$ to the length $L_{220}$ is in a range of 2:1 to 20:1. In some embodiments, the length $L_{220}$ is in a range of 0.1 to 20 mm. In some embodiments, as shown in FIGS. 5B and 5C, the fillet 220 has an interior angle σi which is in a range of 10 to 90 degrees. In some embodiments, as shown in FIG. 4D, the fillet 220 is rounded.

Figure 6:
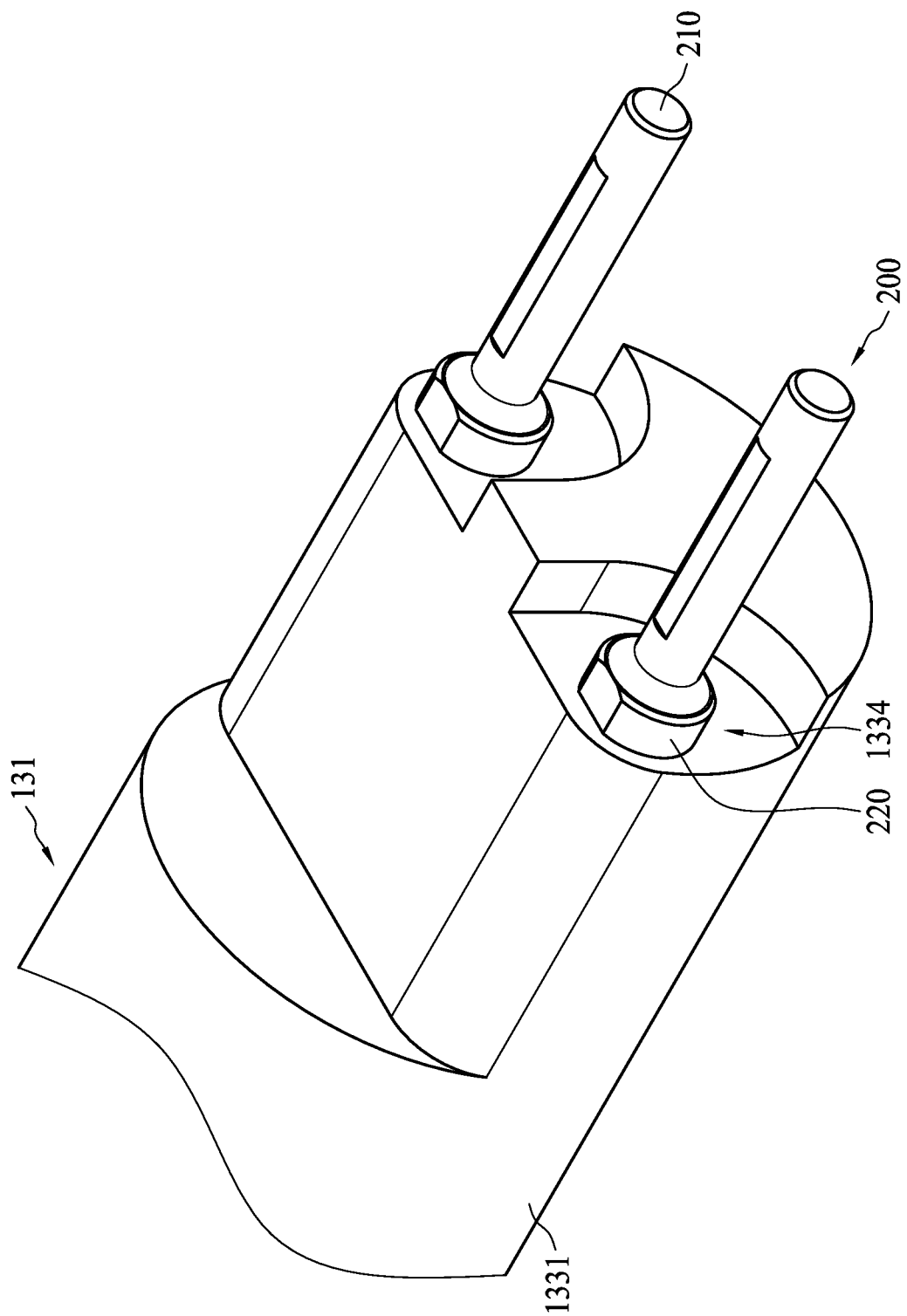
FIG. 6 is an enlarged schematic view of a portion of a pin member according to aspects of the present disclosure in some embodiments.

FIG. 6 is an enlarged schematic view of a portion of a pin member according to aspects of the present disclosure in some embodiments. In some embodiments, referring to FIGS. 3 and 5, the linkage unit 133 further includes a gasket 1333 disposed between the rod member 1331 and the pin member 200. The gasket 1333 may disperse the stress of the pin member 200. The gasket 1333 may fill a gap between the fillet 200 and the rod member 1331. In some embodiments, the gasket 1333 surrounds a portion of the pin member 200. In some embodiments, the gasket 1333 surrounds a portion of the protruding portion 210. In some embodiments, the gasket 1333 surrounds a portion of the fillet 220. In some embodiments, the gasket 1333 surrounds a portion of the threaded portion 230. In some embodiments, the rod member 1331 further includes a gasket recess 1334, and the gasket 1333 is disposed in the gasket recess 1334. In some embodiments, the threaded recess 1332 is disposed in the gasket recess 1334.

FIGS. 7A to 7F are schematic views of a gasket according to aspects of the present disclosure in some embodiments. In some embodiments, the gasket 1333 includes a through hole 1335 configured to surround a portion of the pin member 200. The shape of the gasket is not particularly limited, and may be circular as shown in FIGS. 7A to 7D, or square as shown in FIGS. 7E and 7F. In some embodiments, the gasket 1333 is serrated as shown in FIGS. 7B and 7D.

Figure 8A:
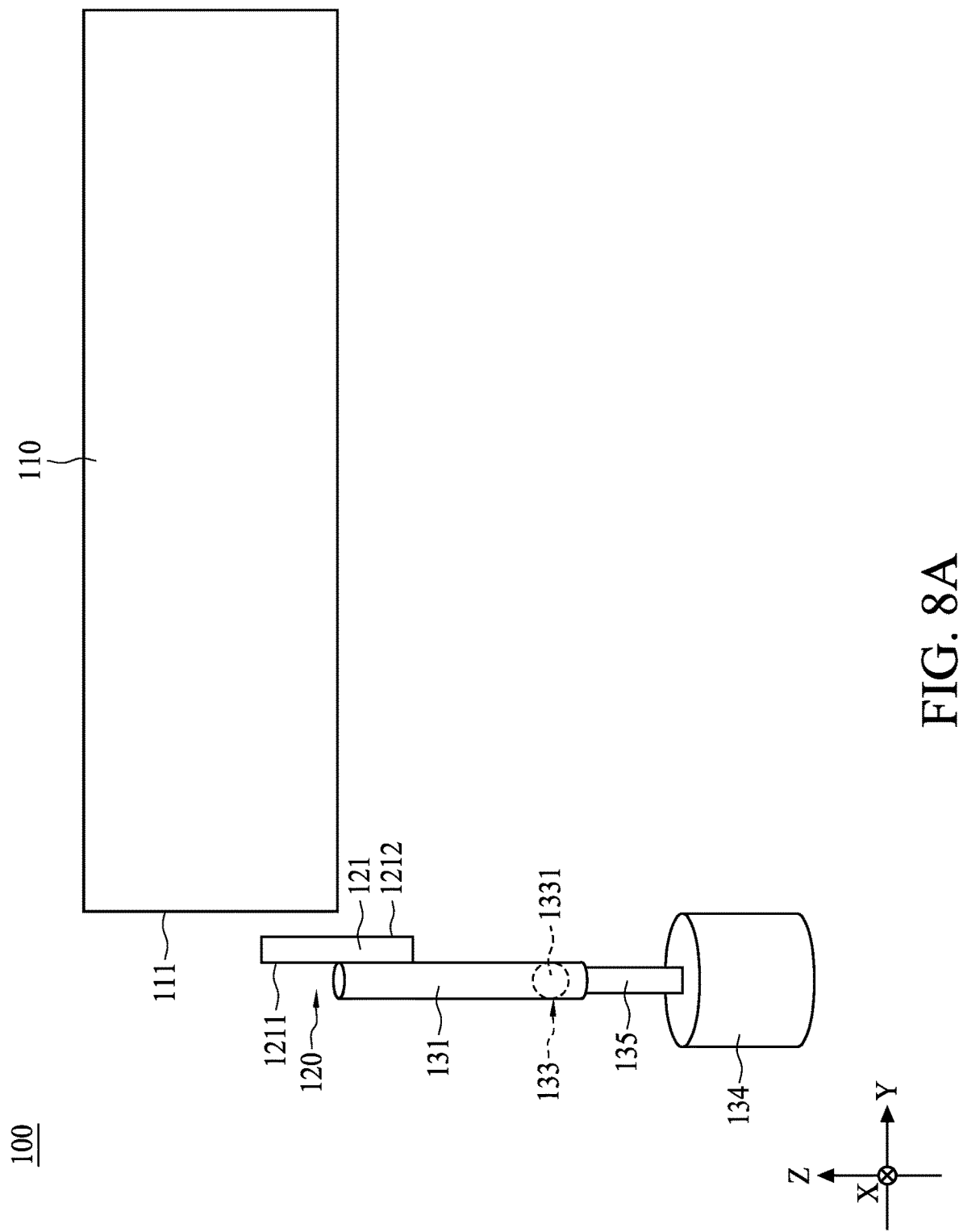
FIGS. 8A to 8C are schematic views of a processing unit according to aspects of the present disclosure in some embodiments.
Figure 8B:
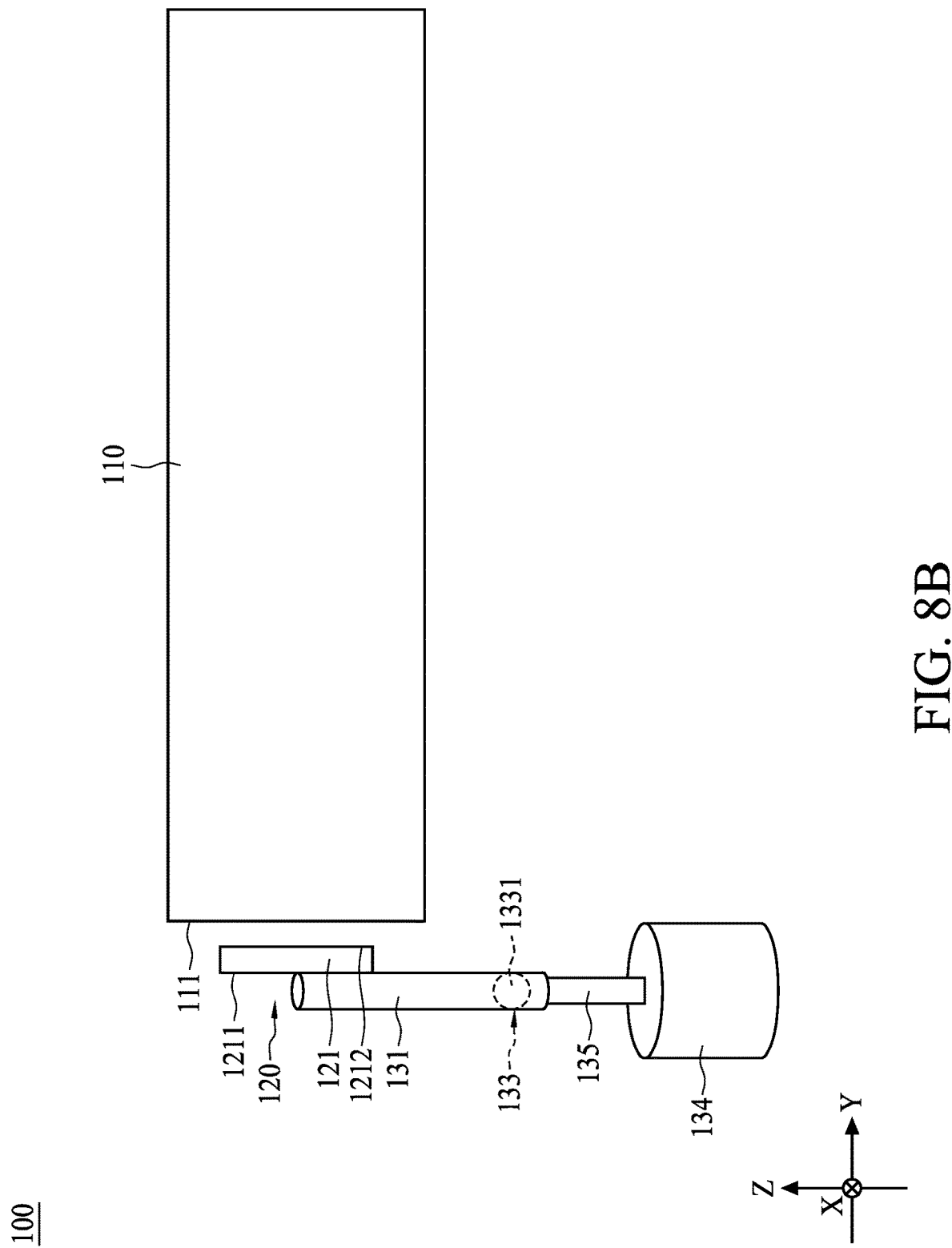
Figure 8C:
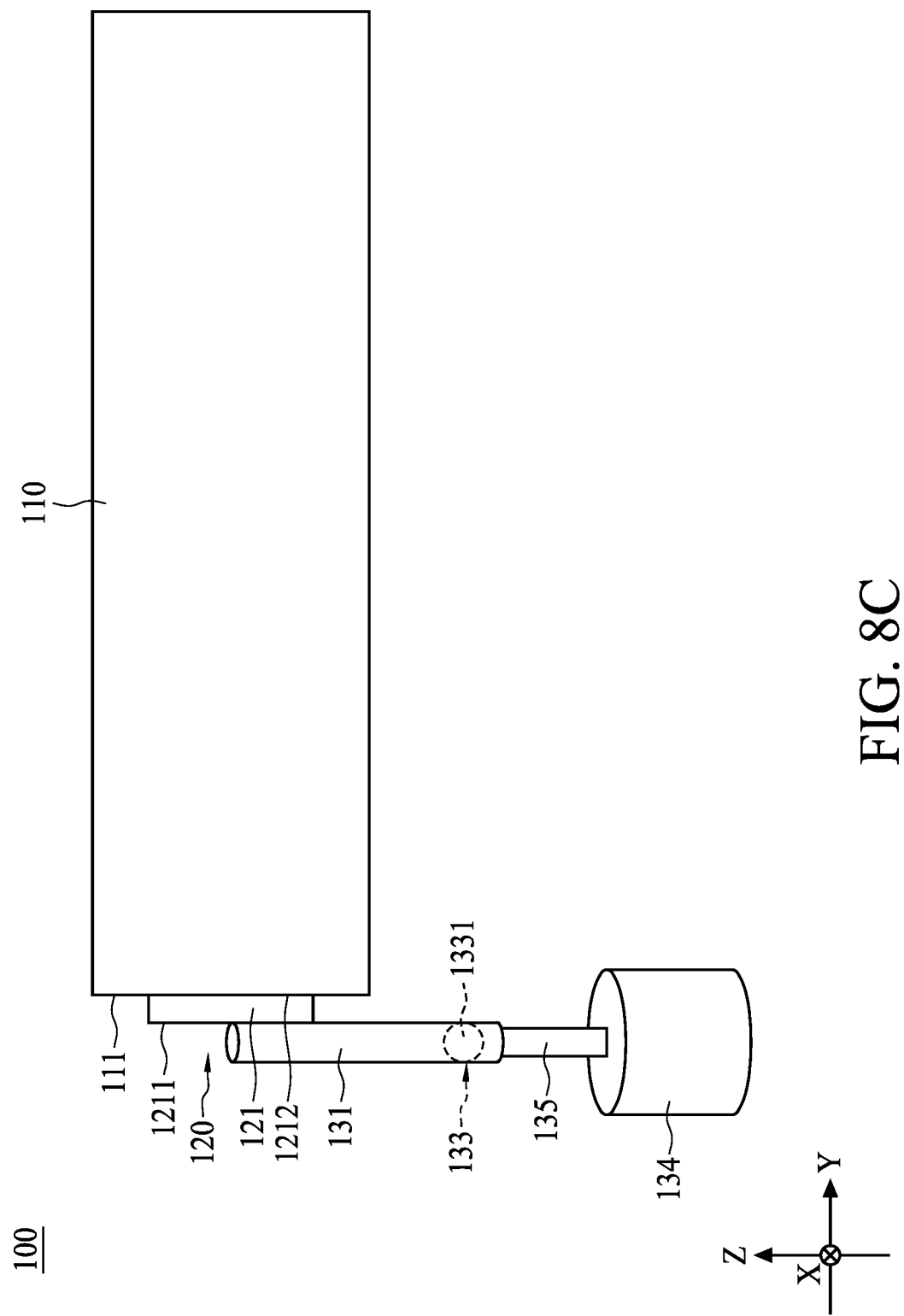

FIGS. 8A to 8C are schematic views of a processing unit according to aspects of the present disclosure in some embodiments. In some embodiments, referring to FIG. 2 and FIGS. 8A to 8C, the actuator unit 130 further includes a pneumatic cylinder 134 and a pneumatic actuating member 135 connecting the pneumatic cylinder 134 and the linkage unit 133. In some embodiments, the pneumatic cylinder 134 and the pneumatic actuating member 135 are configured to move the rod member 1331, the pin member 200, the first and second supporting members 131, 132 and the door plate 121.

In some embodiments, the pneumatic cylinder 134 and the pneumatic actuating member 135 are configured to move the rod member 1331 toward the opening 111. In some embodiments, the rod member 1331 extends along an X direction, and the pneumatic cylinder 134 and the pneumatic actuating member 135 are configured to move the rod member 1331 toward the opening 111 along a Z direction perpendicular to the X direction. In some embodiments, as shown in FIG. 8A and FIG. 2, the chamber 110 is in an open configuration when the door plate 121 is at a first position, and the substrate 102 may enter or exit the chamber 110 through the opening 111 when the door plate 121 is at the first position. In some embodiments, the chamber 110 is in an open configuration when the second surface 1212 is separated from the chamber 110.

In some embodiments, the pneumatic cylinder 134 may apply a first force to the pneumatic actuating member 135, the rod member 1331 and the first supporting member 131 to move the door plate 121 from the first position to a third position. In some embodiments, as shown in FIG. 8B, when the door plate 121 is at the third position, the door plate 121 is close to the opening 111 but does not yet seal the opening 111, and the substrate 102 cannot enter or exit the chamber 110 through the opening 111.

In some embodiments, the pneumatic cylinder 134 applies a second force to move the door plate 121 from the third position to a second position as shown in FIG. 8C and FIG. 3. In some embodiments, the actuator cylinder 134 is disposed on the first supporting arm 131 and/or the second supporting arm 132. In some embodiments, the second force moves the door plate 121 along a Y direction perpendicular to the X direction and the Z direction. In some embodiments, as shown in FIG. 8C, when the door plate 121 is at the second position, the door plate 121 covers and seals the opening 111. In some embodiments, as shown in FIG. 8C, when the door plate 121 is at the second position, the second surface 1212 is attached to the chamber 110. The substrate 102 cannot enter or exit the chamber 110 through the opening 111. In some embodiments, the slit door assembly 120 keeps the chamber 110 sealed and completely isolated from the external environment when the door plate 121 is at the second position.

In some embodiments, the rod member 1331 is rotatable. In some embodiments, the rod member 1331 is rotatable about an axis extending along a length of the rod member 1331. In some embodiments, the second force rotates the rod member 1331 to move the door plate 121 from the third position (as shown in FIG. 8B) to the second position (as shown in FIG. 8C). In some embodiments, when the rod member 1331 is rotated, the pin members 200 is also rotated about the axis of the length of the rod member 1331. In some embodiments, when the rod member 1331 is rotated, the spring disposed on the pin member 200 is stretched by pulling.

Figure 9:
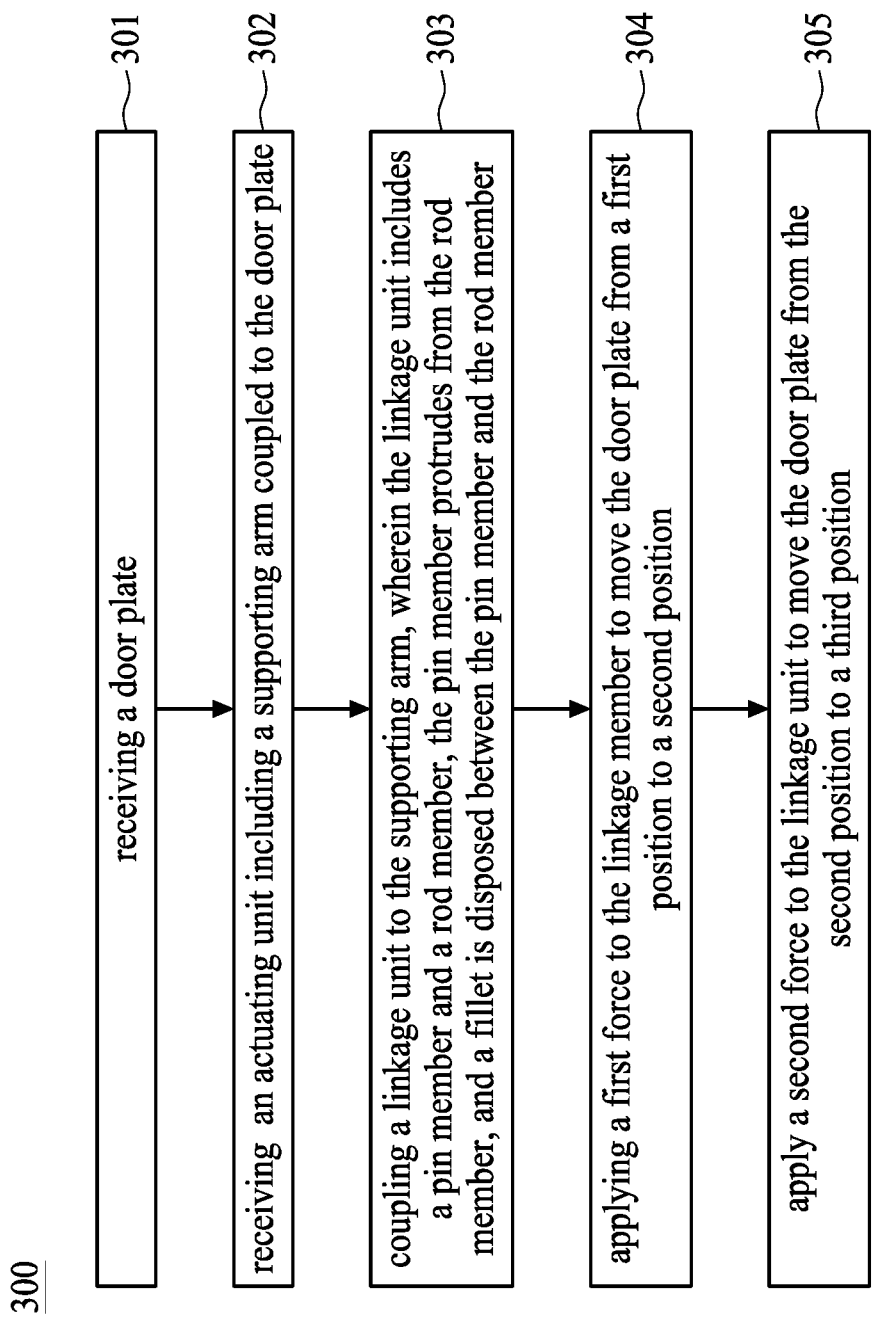
FIG. 9 is a flowchart of a method of operating a slit door assembly in accordance with some embodiments of the present disclosure.

FIG. 9 is a flowchart of a method 300 of operating a slit door assembly in accordance with some embodiments of the present disclosure. The method 300 includes several operations: (301) receiving a door plate; (302) receiving an actuating unit including a supporting arm coupled to the door plate; (303) coupling a linkage unit to the supporting arm, wherein the linkage unit and includes a pin member and a rod member, the pin member protrudes from the rod member and a fillet is disposed between the pin member and the rod member; (304) applying a first force to the linkage unit to move the door plate from a first position to a second position; and (305) applying a second force to the linkage unit to move the door plate from the second position to a third position.

Figure 10:
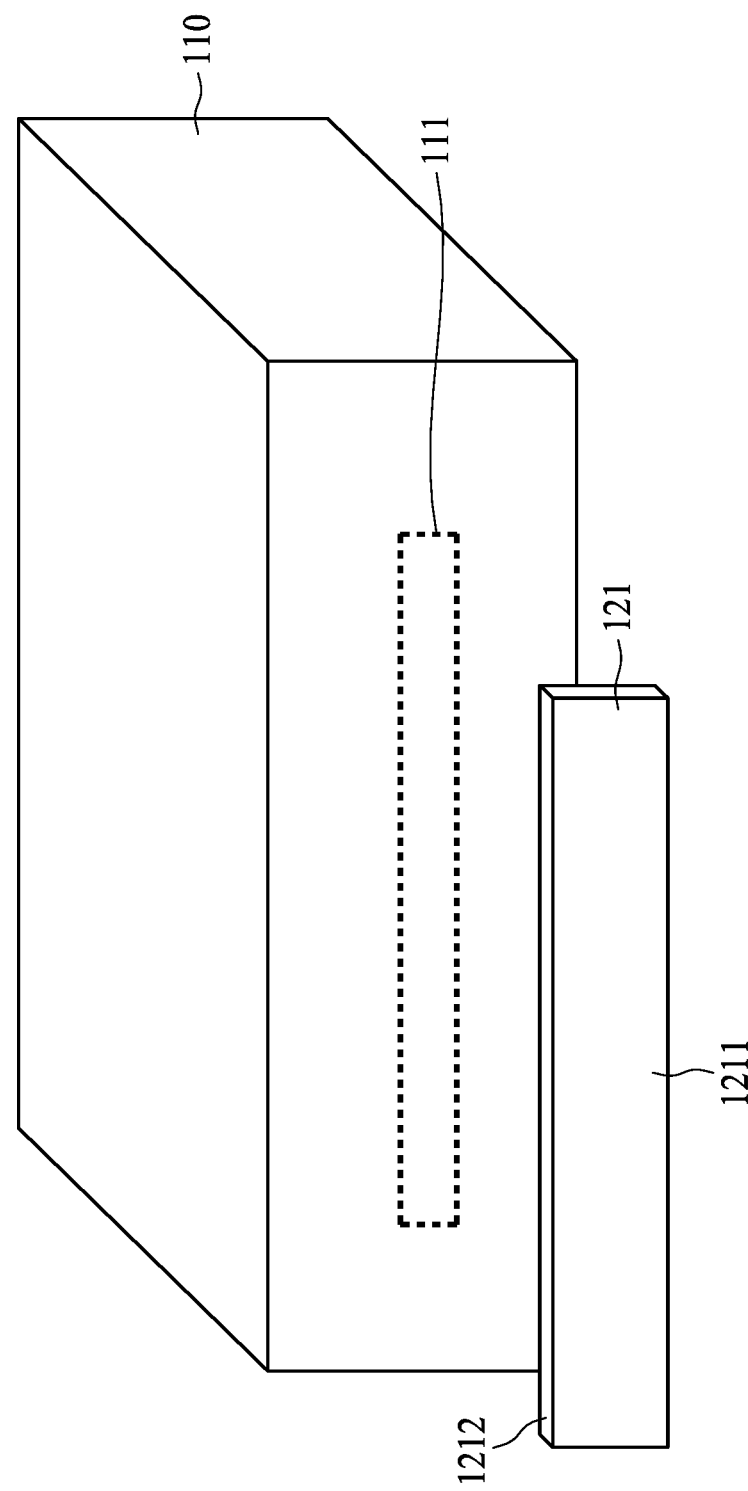
FIGS. 10 to 13 are schematic views of one or more stages of the method of operating a slit door assembly in accordance with some embodiments of the present disclosure.

FIGS. 10 to 14 are schematic views of one or more stages of the method of operating a slit door assembly using the method 300 in accordance with some embodiments of the present disclosure. In some embodiments, the method 300 is configured to form and operate the slit door assembly 120 as illustrated in FIGS. 1, 2 and 3. Referring to FIG. 10, in operation 301, a door plate 121 having a surface 1211 is received. In some embodiments, the door plate 121 is adjacent to an opening 111 of a chamber 110.

In operation 302, a first supporting arm 131 coupled to the door plate 121 is received. In some embodiments, a second supporting arm 132 coupled to the door plate 121 is also received. In some embodiments, the first and second supporting arms 131, 132 are coupled to the surface 1211 of the door plate 121. In some embodiments, a first end 1311 of the first supporting arm 131 and a first end 1321 of the second supporting arm 132 are coupled to the surface 1211 of the door plate 121.

In operation 303, a linkage unit 133, coupled to the first and second supporting arms 131, 132 and including a pin member 200 and a rod member 1331, is received. The pin member 200 protrudes from the rod member 1331 and a fillet 220 is disposed between the pin member 200 and the rod member 1331.

In some embodiments, a threaded portion 230 of the pin member 200 is screwed into a threaded recess 1332 of the rod member 1331. In some embodiments, protruding portions 210 of each of the pin members 200 are receivable by the first and second recesses 1313, 1323 of the first and second supporting arms 131, 132. In some embodiments, the fillets 220 of each of the pin members 200 are receivable by the first and second recesses 1313, 1323 of the first and second supporting arms 131, 132.

Figure 11:
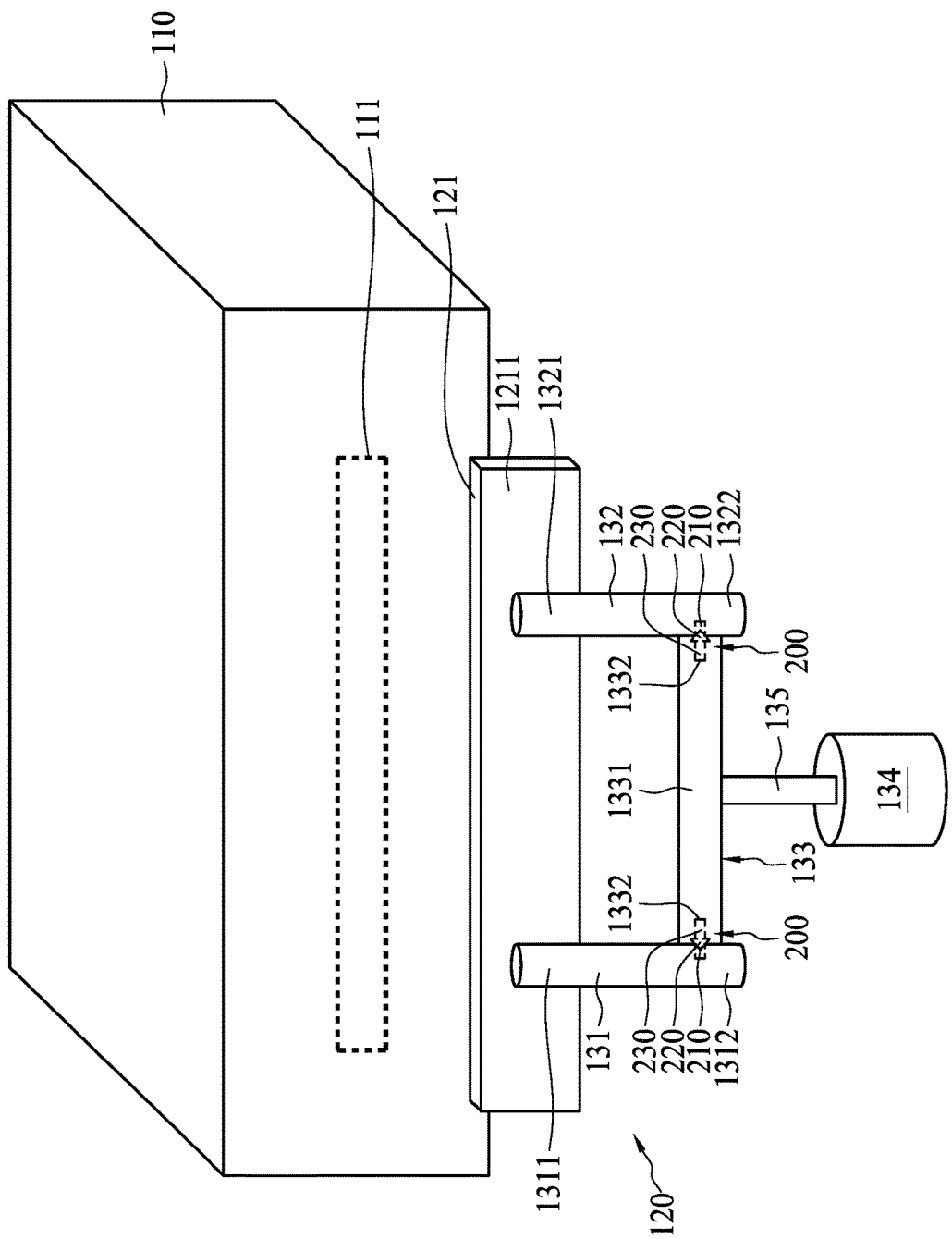
Figure 12:
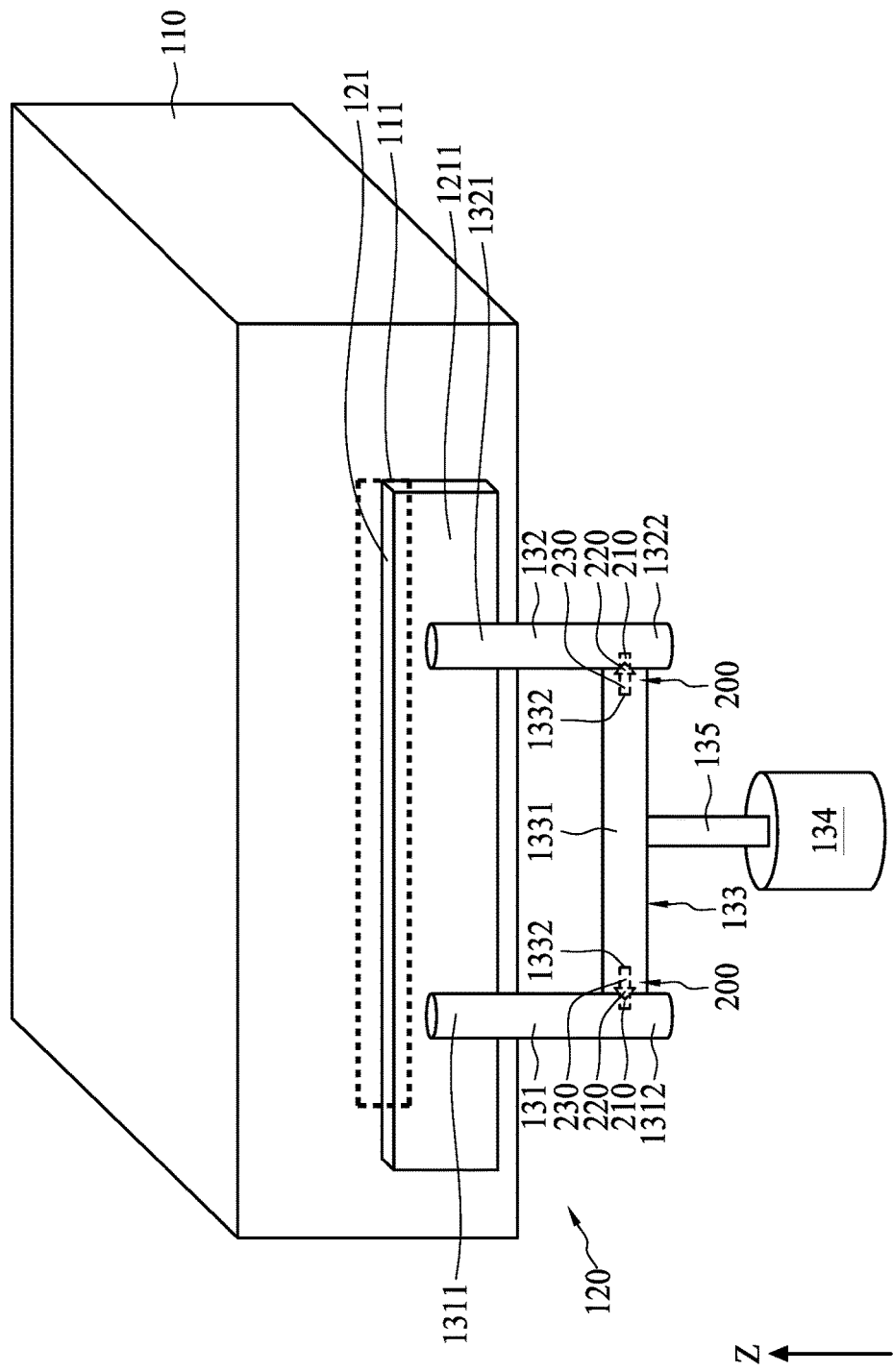

As illustrated in FIGS. 11 and 12, in operation 304, a first force is applied to the linkage unit 133 to move the door plate 121 from a first position (as shown in FIGS. 8A and 11) to a third position (as shown in FIGS. 8B and 12). In some embodiments, a pneumatic cylinder 134 and a pneumatic actuating member 135 connecting the pneumatic cylinder 134 to the linkage unit 133 are provided. In some embodiments, the first force is applied to the pneumatic actuating member 135, the rod member 1331 and the first supporting member 131 to move the door plate 121 from the first position to a third position. In some embodiments, the first force is along the Z direction and moves the door plate 121 toward the opening 111. In some embodiments, when the door plate 121 is at a first position, the chamber 110 is in an open configuration. In some embodiments, when the door plate 121 at the third position after the first force is applied, the door plate 121 is close to the opening 111 but does not seal the opening 111, the substrate 102 cannot enter or exit the chamber 110.

Figure 13:
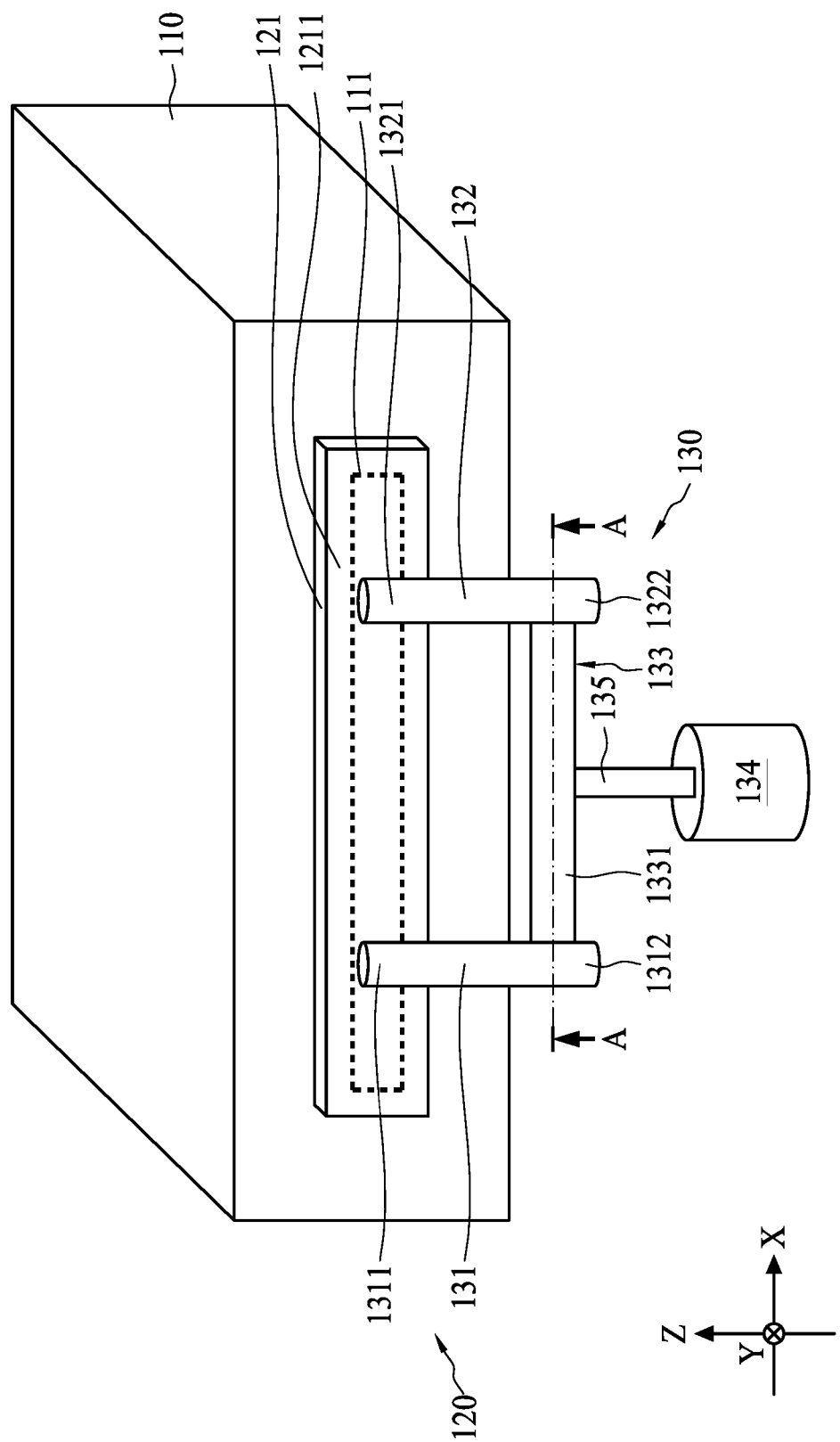

As illustrated in FIG. 13, in operation 305, a second force is applied to the linkage unit 133 to move the door plate 121 from the third position (as shown in FIG. 8B) to a second position (as shown in FIGS. 8C and 13). In some embodiments, the second force is applied to the rod member 1331 and the first supporting member 131 to move the door plate 121 from the third position to the second position. In some embodiments, the second force moves the door plate 121 along the Y direction. In some embodiments, as shown in FIGS. 8C and 13, after the second force is applied, the door plate 121 is at the second position and the opening 111 is covered and sealed by the door plate 121. In some embodiments, the second force rotates the rod member 1331 about an axis extending along a length of the rod member 1331. In some embodiments, when the rod member 1331 is rotated, the pin members 200 are also rotated about the axis extending along the length of the rod member 1331. In some embodiments, when the door plate 121 is moved from the first position to the second position through the third position, the door plate 121 is moved in an L-shaped path.

One aspect of this disclosure relates to a slit door assembly. The slit door assembly includes a door plate, a supporting arm including a first end coupled to the door plate and a second end away from the first end, and a linkage unit including a rod member and a pin member protruding from the rod member, wherein the linkage unit is connected to the second end of the supporting arm. A fillet is disposed between the pin member and the rod member.

In some embodiments, the pin member is attachable to and detachable from the rod member. In some embodiments, the pin member is integral with the rod member. In some embodiments, an interior angle between the fillet and the rod member is in a range of 10 to 90 degrees. In some embodiments, the fillet is a flange. In some embodiments, the fillet is rounded. In some embodiments, the rod member includes a threaded recess, and the pin member includes a threaded portion, wherein the threaded portion is receivable by the threaded recess. In some embodiments, the linkage unit further includes a gasket disposed between the rod member and the pin member. In some embodiments, the rod member further includes a gasket recess, and the gasket is disposed in the gasket recess.

An aspect of this disclosure relates to a processing unit for processing a substrate. The processing unit includes a chamber having an opening for accessing the chamber; and a door plate adjacent to the opening and movable between a first position and a second position. The chamber is in an open configuration when the door plate is at the first position, and the chamber is in a closed configuration when the door plate is at the second position. The processing unit further includes an actuating unit coupled to the door plate and operable to move the door plate between the first and second positions. The actuating unit includes a supporting arm coupled to the door plate; and a linkage unit including a rod member and a pin member protruding from the rod member and connected to the supporting arm. A fillet is disposed between the pin member and the rod member, and the supporting arm includes a recess configured to receive at least a portion of the pin member.

In some embodiments, the pin member is attachable to and detachable from the rod member. In some embodiments, the pin member includes a protruding portion disposed in the recess. In some embodiments, the protruding portion and the fillet are disposed in the recess. In some embodiments, the rod member includes a threaded recess, and the pin member includes a threaded portion, and the threaded portion is receivable by the threaded recess.

In some embodiments, the rod member is rotatable. In some embodiments, the pin member includes a protruding portion and a threaded portion, and the fillet is disposed between the protruding portion and the threaded portion. In some embodiments, the actuator unit further includes a pneumatic cylinder and a pneumatic actuating member connecting the pneumatic cylinder to the linkage unit. In some embodiments, an exterior angle between the fillet and the rod member is in a range of 90 to 170 degrees.

An aspect of this disclosure relates to a method of operating a slit door assembly. The method includes receiving a door plate; receiving an actuating unit including a supporting arm coupled to the door plate; and coupling a linkage unit to the supporting arm, wherein the linkage unit includes a pin member and a rod member, the pin member protrudes from the rod member, and a fillet is disposed between the pin member and the rod member. The method further includes applying a first force to the linkage unit to move the door plate from a first position to a second position.

In some embodiments, the method further includes assembling a threaded portion of the pin member to a threaded recess of the rod member. In some embodiments, the method further includes applying a second force to the linkage unit to move the door plate from the second position to a third position.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A slit door assembly, comprising
a door plate;
a supporting arm including a first end coupled to the door plate, a second end away from the first end, and a first recess disposed at the second end; and
a linkage unit including a rod member and a pin member protruding from the rod member and at least partially disposed within the first recess to connect to the second end of the supporting arm,
wherein a fillet at least partially surrounds the pin member and is disposed between the second end of the supporting arm and the rod member.

2. The slit door assembly of claim 1, wherein the pin member is attachable to and detachable from the rod member.

3. The slit door assembly of claim 1, wherein the pin member is integral with the rod member.

4. The slit door assembly of claim 1, wherein an interior angle between the fillet and the rod member is in a range of 10 to 90 degrees.

5. The slit door assembly of claim 1, wherein the fillet is a flange.

6. The slit door assembly of claim 1, wherein the fillet is rounded.

7. The slit door assembly of claim 1, wherein the rod member includes a threaded recess, and the pin member includes a threaded portion, wherein the threaded portion is receivable by the threaded recess.

8. The slit door assembly of claim 1, wherein the linkage unit further includes a gasket disposed between the rod member and the pin member.

9. The slit door assembly of claim 8, wherein the rod member further includes a second recess, and the gasket is disposed in the second recess.

10. A processing unit for processing a substrate, comprising:
a chamber having an opening for accessing the chamber;
a door plate adjacent to the opening and movable between a first position and a second position, wherein the chamber is in an open configuration when the door plate is at the first position, and the chamber is in a closed configuration when the door plate is at the second position;
an actuating unit coupled to the door plate and operable to move the door plate between the first and second positions, wherein the actuating unit includes:
a supporting arm coupled to the door plate; and
a linkage unit including a rod member and a pin member protruding from the rod member and connected to the supporting arm, wherein the pin member includes a protruding portion extending into the supporting arm, a threaded portion extending into the rod member, and a fillet at least partially surrounding the pin member and disposed between the protruding portion and the threaded portion.

11. The processing unit according to claim 10, wherein the pin member is attachable to and detachable from the rod member.

12. The processing unit according to claim 10, wherein the protruding portion is disposed in a recess of the supporting arm.

13. The processing unit according to claim 12, wherein the protruding portion and the fillet are disposed in the recess.

14. The processing unit according to claim 10, wherein the rod member includes a threaded recess configured to receive the threaded portion.

15. The processing unit according to claim 10, wherein the rod member is rotatable.

16. The processing unit according to claim 10, wherein the fillet is tapered from the threaded portion towards the protruding portion.

17. The processing unit according to claim 10, wherein the actuator unit further includes a pneumatic cylinder and a pneumatic actuating member connecting the pneumatic cylinder to the linkage unit.

18. The processing unit according to claim 10, wherein an exterior angle between the fillet and the rod member is in a range of 90 to 170 degrees.

19. A method of operating a slit door assembly, comprising:
providing a chamber having an opening for accessing the chamber, a door plate, and an actuating unit including a supporting arm coupled to the door plate and a linkage unit coupled to the supporting arm, wherein the supporting arm includes a recess disposed at an end of the supporting arm, the linkage unit includes a pin member and a rod member, the pin member protrudes from the rod member and is at least partially disposed within the recess to connect to the end of the supporting arm, and a fillet at least partially surrounds the pin member and is disposed between the end of the supporting arm and the rod member; and
applying a first force to the linkage unit to vertically move the door plate, the supporting arm and the linkage unit, thereby the door plate is moved from a first position away from the opening to a second position adjacent to the opening.

20. The method of claim 19, wherein the method further comprises:
assembling a threaded portion of the pin member to a threaded recess of the rod member;
applying a second force to the linkage unit to move the door plate from the second position to a third position.

* * * * *